United States Patent [19]

Scherber et al.

[11] Patent Number: 5,858,813
[45] Date of Patent: Jan. 12, 1999

[54] CHEMICAL MECHANICAL POLISHING SLURRY FOR METAL LAYERS AND FILMS

[75] Inventors: Debra L. Scherber, El Dorado Hills, Calif.; Vlasta Brusic Kaufman, Geneva, Ill.; Rodney C. Kistler, St. Charles, Ill.; Brian L. Mueller; Christopher C. Streinz, both of Aurora, Ill.

[73] Assignee: Cabot Corporation, Boston, Mass.

[21] Appl. No.: 644,509

[22] Filed: May 10, 1996

[51] Int. Cl.$^6$ .............................. C09K 13/00; H01L 21/00
[52] U.S. Cl. ......................... 438/693; 252/79.2; 252/79.4
[58] Field of Search ................................. 252/79.1, 79.2, 252/79.4; 216/89; 156/636.1; 438/692, 693

[56] References Cited

U.S. PATENT DOCUMENTS

| T105,402 | 5/1985 | Basi et al. . | |
|---|---|---|---|
| 5,476,606 | 12/1995 | Brancaleoni et al. | 252/79.1 |
| 5,525,191 | 6/1996 | Maniar et al. | 156/636.1 |
| 5,527,423 | 6/1996 | Neville et al. | 156/636.1 |
| 5,575,885 | 11/1996 | Hirabayashi et al. | 156/626.1 |
| 5,614,444 | 3/1997 | Farkas et al. | 437/225 |

FOREIGN PATENT DOCUMENTS 0 121 707 B1  9/1988  European Pat. Off. .

OTHER PUBLICATIONS

Acherman, et al., *U.S. Dept. of the Interior, Bureau of Mines*, pp. 1–59, Corrosion Properties of Molybdenum, Tungsten, Vanadium, and Some Vanadium Alloys (1966).

*Primary Examiner*—Thi Dang

[57] ABSTRACT

A polishing slurry for chemically mechanically polishing metal layers and films during the various stages of multilevel interconnect fabrication associated with integrated circuit manufacturing. The slurry includes an aqueous medium, an abrasive, an oxidizing agent, and an organic acid. The polishing slurry has been found to significantly lower or inhibit the silicon dioxide polishing rate, thus yielding enhanced selectivity. In addition, the polishing slurry is useful in providing effective polishing to metal layers at desired polishing rates while minimizing surface imperfections and defects.

Also disclosed is a method for producing coplanar metal/insulator films on a substrate utilizing the slurry of the present invention and chemical mechanical polishing technique relating thereto.

55 Claims, 3 Drawing Sheets

CHEMICAL MECHANICAL POLISHING SLURRY FOR METAL LAYERS AND FILMS

BACKGROUND OF THE INVENTION

1. Field of the Invention

The present invention relates to a chemical mechanical polishing slurry for semiconductor integrated circuit manufacturing and, more particularly, to improved chemical mechanical polishing slurries for polishing metal layers and thin-films used in semiconductor integrated circuit manufacturing.

2. Background of the Related Art

A semiconductor wafer typically includes a substrate, such as a silicon or gallium arsenide wafer, on which a plurality of transistors have been formed. Transistors are chemically and physically connected into a substrate by patterning regions in the substrate and layers on the substrate. The transistors are interconnected through the use of well known multilevel interconnects to form functional circuits. Typical multilevel interconnects are comprised of stacked thin-films consisting of one or more of the following: titanium (Ti), titanium nitrite (TiN), tantalum (Ta), aluminum-copper (Al—Cu), aluminum silicon (Al—Si), copper (Cu), tungsten (W), and various combinations thereof.

The traditional technique for forming interconnects has been improved by the disclosure of U. S. Pat. No. 4,789,648 to Chow et al. relating to a method for producing coplanar multilevel metal/insulator films on a substrate. This technique, which has gained wide interest and produces multilevel interconnects, utilizes chemical mechanical polishing (CMP) to planarize the surface of the metal layers or thin-films during the various stages of device fabrication. In general, CMP involves the concurrent chemical and mechanical polishing of an overlying first layer to expose the surface of a non-planar second layer on which the first layer is formed. One such process is described in U. S. Pat. No. 4,789,648 to Beyer et al., the specification of which are incorporated herein by reference. Briefly, Beyer et al. discloses a CMP process using a polishing pad and a slurry to remove a first layer at a faster rate than a second layer until the surface of the overlying material becomes coplanar with the upper surface of the initially covered second layer. For a more detailed explanation of chemical mechanical polishing, please see U. S. Pat. Nos. 4,671,851, 4,910,155 and 4,944,836, the specifications of which are incorporated herein by reference.

Polishing slurry composition is an important factor in providing a manufacturable chemical mechanical polishing process. Typical polishing slurries available for CMP processes contain an abrasive such as silica or alumina in an acidic or basic solution. For example, U. S. Pat. No. 4,789,648 to Beyer et al. discloses a slurry formulation using alumina abrasives in conjunction with sulfuric, nitric, acetic acids and deionized water. Similarly, U. S. Pat. No. 5,209,816 to Yu et al. discloses a slurry for polishing aluminum using alumina abrasives in conjunction with phosphoric acid, hydrogen peroxide, and deionized water. U. S. Pat. Nos. 5,391,258 and 5,476,606 to Brancaleoni et al. discloses a slurry for polishing a composite of metal and silica which includes an aqueous medium, abrasive particles and an anion which controls the rate of removal of silica. The anion contains at least two acid groups and the pKa of the first dissociable acid is not substantially larger than the pH of the polishing slurry, wherein the term substantially is defined as 0.5 units.

Other polishing slurries for use in CMP processes are described in U. S. Pat. No. 5,354,490 to Yu et al., U. S. Pat. No. 5,340,370 to Cadien et al., U. S. Pat. No. 5,209,816 to Yu et al., U. S. Pat. No. 5,157,876 to Medellin, U. S. Pat. No. 5,137,544 to Medellin, and U. S. Pat. No. 4,956,313 to Cote et al., the specifications of which are incorporated herein by reference.

Although many of the slurry compositions are suitable for limited purposes, the slurries described above tend to produce poor film removal traits for the underlying films or produce deleterious film-corrosion which leads to poor manufacturing yield of typical multilevel metallization structures. In addition, the polishing slurries tend to exhibit unacceptable polishing rates and corresponding selectivity levels to the insulator media.

Accordingly, a need remains for improved polishing slurries and processes related thereto which provide uniform metal layers and thin-films, free from undesirable contaminants and surface imperfections. In particular, it is highly desirous to produce a polishing slurry for multilevel interconnects having low selectivity to the barrier films, e.g., Ti, TiN, Ta, and high selectivity to the insulator media surrounding the multilevel interconnects, e.g., silica, spin on glass, and low-k dielectric materials, which are not hazardous or corrosive. A further need remains for a single slurry which is capable of providing both the low selectivities and high selectivities to the barrier and insulator films, respectively.

SUMMARY OF THE INVENTION

The present invention is directed to a chemical mechanical polishing slurry for polishing metal layers and thin-films. The polishing slurry includes an aqueous medium, an abrasive, an oxidizing agent, and organic acid. In one preferred embodiment, the abrasive is a metal oxide abrasive consisting of metal oxides aggregates having a size distribution less than about 1.0 micron, a mean aggregate diameter less than about 0.4 micron and a force sufficient to repel and overcome the van der Waals forces between abrasive aggregates themselves. In another preferred embodiment, the abrasive is a metal oxide abrasive consisting of discrete, individual metal oxide spheres having a primary particle diameter less than 0.4 micron (400 nm) and a surface area ranging from about 10 $m^2$/g to about 250 $m^2$/g. Also disclosed is a method of polishing metal layers with the polishing slurry of the present invention.

Depending on the choice of the oxidizing agent, the organic acid, and other desirable additives, the polishing slurry can be tailored to provide effective polishing to metal layers at desired polishing rates while minimizing surface imperfections, defects and uncontrollable corrosion. In addition, the polishing slurry of the present invention has been found to significantly lower or inhibit the silicon dioxide polishing rate, thus yielding enhanced selectivity with respect to the insulator layer. Furthermore, the polishing slurry may be effectively used to provide controlled polishing selectivities to other thin-film materials used in current integrated circuit technology, such as titanium, titanium nitride and the like.

DETAILED DESCRIPTION OF THE INVENTION

Figure 1:
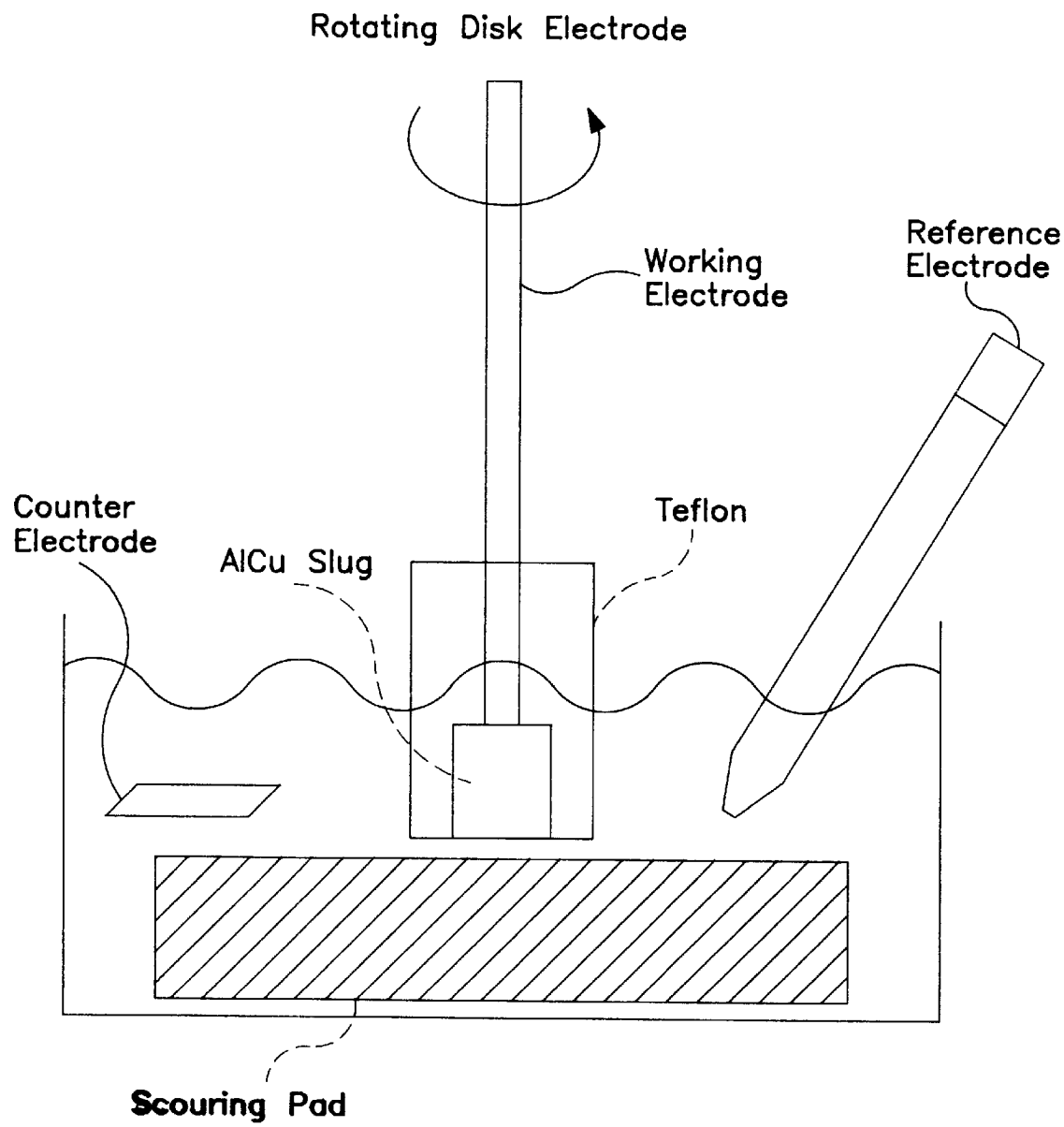
FIG. 1 is a schematic of the set-up used for the electrochemical measurements of metallic dissolution during and after abrasion, as illustrated in Example 6.

The present invention is directed to a chemical mechanical polishing slurry for polishing metal layers and thin-films which includes an aqueous medium, an abrasive, an oxidizing agent, and an organic acid. The polishing slurry has been found to yield high selectivity to the insulator layer. Preferably, the polishing slurry further provides low selectivity to the barrier metal layer or thin-film.

The abrasive is typically a metal oxide abrasive characterized as having a surface area, as calculated from the method of S. Brunauer, P. H. Emmet, and I. Teller, J. Am. Chemical Society, Volume 60, Page 309 (1938) and commonly referred to as BET, ranging from about 5 $m^2/g$ to about 430 $m^2/g$ and should be of a high purity. High purity means that the total impurity content, from sources such as raw material impurities and trace processing contaminants, is typically less than 1% and preferably less than 0.01% (i. e. 100 ppm).

The metal oxide abrasive of the present invention is selected from the group of alumina, titania, zirconia, germania, silica, ceria and mixtures thereof. Preferably, the metal oxide is a fumed or precipitated abrasive and, more preferably is a fumed abrasive. The metal oxide abrasive may be produced utilizing techniques known to those skilled in the art. For example, the production of fumed metal oxides is a well-documented process which involves the hydrolysis of suitable feedstock vapor (such as aluminum chloride for an alumina abrasive) in a flame of hydrogen and oxygen. Molten particles of roughly spherical shapes are formed in the combustion process, the diameters of which are varied through process parameters. These molten spheres of alumina or similar oxide, typically referred to as primary particles, fuse with one another by undergoing collisions at their contact points to form branched, three dimensional chain-like aggregates. The force necessary to break aggregates is considerable and often considered irreversible. During cooling and collecting, the aggregates undergo further collision that may result in some mechanical entanglement to form agglomerates. Agglomerates are thought to be loosely held together by van der Waals forces and can be reversed, i.e. de-agglomerated, by proper dispersion in a suitable media.

Precipitated abrasives may be manufactured utilizing conventional techniques and are typically formed by the coagulation of the desired particles from an aqueous medium under the influence of high salt concentrations, acids or other coagulants. The particles are filtered, washed, dried and separated from residues of other reaction products by conventional techniques known to those skilled in the art. In addition, the abrasive may be produced from other suitable technologies, such as sol-gel and plasma processing.

In one preferred embodiment, the metal oxide abrasive consists of metal oxides aggregates having a size distribution less than about 1.0 micron, a mean aggregate diameter less than about 0.4 micron and a force sufficient to repel and overcome the van der Waals forces between abrasive aggregates themselves. Such metal oxide abrasive has been found to be effective in minimizing or avoiding scratching, pit marks, divots and other surface imperfections during polishing. The aggregate size distribution in the present invention may be determined utilizing known techniques such as transmission electron microscopy (TEM). The mean aggregate diameter refers to the average equivalent spherical diameter when using TEM image analysis, i. e. based on the cross-sectional area of the aggregate. By force is meant that either the surface potential or the hydration force of the metal oxide particles must be sufficient to repel and overcome the van der Waals attractive forces between the particles.

In another preferred embodiment, the metal oxide abrasive consists of discrete, individual metal oxide spheres having a primary particle diameter less than 0.4 micron (400 nm) and a surface area ranging from about 10 $m^2/g$ to about 250 $m^2/g$.

Preferably, the metal oxide abrasive is incorporated into the aqueous medium of the polishing slurry as a concentrated aqueous dispersion of metal oxides, which aqueous dispersion of metal oxide abrasives typically ranges from about 3% to about 45% solids and, preferably, between 10% and 20% solids. The aqueous dispersion of metal oxides may be produced utilizing conventional techniques, such as slowing adding the metal oxide abrasive to an appropriate media, for example, deionized water, to form a colloidal dispersion. The dispersion is typically completed by subjecting it to high shear mixing conditions known to those skilled in the art. The pH of the slurry may be adjusted away from the isoelectric point, as described below, to maximize colloidal stability.

In a more preferred embodiment, the concentrated aqueous dispersion of metal oxides has a mean aggregate size distribution less than 0.3 micron and also have a maximum zeta potential greater than ±10 millivolts. Zeta potential ($\zeta$) is the potential difference, measured in a liquid, between the shear plane and the bulk of the liquid beyond the limits of the electrical double layer. The zeta potential is dependent on the pH of the aqueous medium. For a given metal oxide abrasive composition, the isoelectric point is defined as the pH at which zeta potential is zero. As the pH is increased or decreased away from the isoelectric point, the surface charge is increased negatively or positively, respectively. As the pH continues to increase or decrease, the surface charge will reach an asymptote, the asymptote being referred to as the maximum zeta potential. It should be noted that the maximum zeta potential and isoelectric point are functions of the metal oxide composition and that the maximum zeta potential can be effected by the addition of salts to the aqueous medium. For a more complete discussion of zeta potentials, please see R. J. Hunter, *Zeta Potential in Colloid Science* (Academic Press 1981).

The loading level of the abrasive in the polishing slurry may comprise between 0.5% and 55% of the slurry depending on the degree of abrasion required. The abrasion capability of the metal oxide, in turn, is a function of the particle composition, the degree of crystallinity and the crystalline phase, e. g. gamma or alpha. In order to achieve the desired selectivity and polishing rate, it has been found that the optimum surface area and loading level of the metal oxide abrasive may vary. For example, an alumina abrasive typically has a solids loading level in the final polishing slurry ranging between about 1% and about 12%, preferably between 2% and 8%, more preferably between 3% and 6%.

The oxidizing agent of the present invention is added to the polishing slurry to oxidize the metal layer to its corresponding oxide or ions. For example, in the present invention, an oxidizing agent may be used to oxidize a metal layer to its corresponding oxide, such as aluminum to aluminum oxide or copper to copper oxide. The layer is mechanically polished to remove the respective oxide from the layer. Although a wide range of oxidizing agents may be used, suitable agents include oxidizing metal salts, oxidizing metal complexes, nonmetallic oxidizing acids such as peracetic and periodic acids, iron salts such as nitrates, sulfates, EDTA, citrates, potassium ferricyanide and the like, aluminum salts, sodium salts, potassium salts, ammonium salts, quaternary ammonium salts, phosphonium salts, or other cationic salts of peroxides, chlorates, perchlorates, nitrates, permanganates, persulfates and mixtures thereof. Furthermore, it is expected that water may also be used as an effective oxidizing agent in slurries when electronegative metals are used, such as aluminum. The standard electrochemical potential for the oxidation of, for example, aluminum to $Al^{+3}$-ions is: $E_0=-1.663+0.0197 \log(Al^{+3})$ and for the oxidation to $Al_2O_3$, $E_0=-1.550-0.0591$ pH, expressed in Volts, V, against normal hydrogen electrode, NHE (as defined in "Atlas of Elechtrochemical Equilibria in Aqueous Solutions" by M. Pourbaix, Pergamon Press, New York, 1966). The standard potential for $H_3O^+$ and $H_2O$ reduction is 0 V on the same scale. The actual potential which can be measured during the abrasion of aluminum in some of the electrolytes, without the addition of oxidizers, is -1.4 V vs. NHE. This potential is low enough for vigorous reduction of both $H_3O^+$ and $H_2O$. Electrochemical measurements indicate that the prevailing reduction reaction is that of water.

Typically, the oxidizing agent is present in the slurry in an amount sufficient to ensure rapid oxidation of the metal layer while balancing the mechanical and chemical polishing components of the slurry. As such, the oxidizing agent is typically present in the slurry from about 0.5% to 15% by weight, and preferably in a range between 1% and 7% by weight.

In addition, it has further been found that inorganic acids and salts thereof may be added to the polishing slurry to improve or enhance the polishing rate of the barrier layers in the wafer, such as titanium and tantalum. Preferred inorganic additives include sulfuric acid, phosphoric acid, nitric acid, ammonium salts, potassium salts, sodium salts or other cationic salts of sulfates and phosphates.

A wide range of conventional organic acids may be used in the present invention to enhance the selectivity to oxide polishing rate, such as monofunctional acids, difunctional acids, hydroxyl/carboxylate acids, chelating and non-chelating acids. Preferably, the organic acid is selected from the group of acetic acid, adipic acid, butyric acid, capric acid, caproic acid, caprylic acid, citric acid, glutaric acid, glycolic acid, formic acid, fumaric acid, lactic acid, lauric acid, malic acid, maleic acid, malonic acid, myristic acid, oxalic acid, palmitic acid, phthalic acid, propionic acid, pyruvic acid, stearic acid, succinic acid, tartaric acid, valeric acid and derivatives thereof. It is also believed that the organic acids of the present invention possess the ability to complex or associate with dissolving metals and improve the removal rate of metal thin-films such as aluminum, titanium and the like, during the CMP process.

Typically, the organic acid is present in the slurry, individually or in combination with other organic acids, in an amount sufficient to enhance the oxide selectivity without detrimentally effecting the stability of the slurry. As such, the organic acid is typically present in the slurry from about 0.05 % to 15 % by weight, and preferably in a range between 0.5% and 5.0% by weight.

It has been found that an interrelationship exists between the metal oxide abrasive, the oxidizing agent and the organic acid of the present invention to improve or enhance the selectivity to oxide polishing rate of the polishing slurry.

In order to further stabilize a polishing slurry containing an oxidizing agent against settling, flocculation and decomposition of the oxidizing agent, a variety of additives, such as surfactants, polymeric stabilizers or other surface active dispersing agents, can be used. The surfactant can be anionic, cationic, nonionic, amphoteric and combinations of two or more surfactants can be employed. Furthermore, it has been found that the addition of a surfactant may be useful to improve the within-wafer-non-uniformity (WIWNU) of the wafers, thereby improving the planarity of the surface of the wafer and improving yield.

In general, the amount of an additive used, such as a surfactant, in the present invention should be sufficient to achieve effective steric stabilization of the slurry and will typically vary depending on the particular surfactant selected and the nature of the surface of the metal oxide abrasive. For example, if not enough of a selected surfactant is used, it will have little or no effect on stabilization. On the other hand, too much of the surfactant may result in undesirable foaming and/or flocculation in the slurry. As a result, additives like surfactants should generally be present in a range between about 0.001% and 10% by weight. Furthermore, the additive may be added directly to the slurry or treated onto the surface of the metal oxide abrasive utilizing known techniques. In either case, the amount of additive is adjusted to achieve the desired concentration in the polishing slurry.

The polishing slurry may be produced using conventional techniques known to those skilled in the art. Typically, the oxidizing agent, organic acid and other desired additives, such as surfactants, are mixed into the aqueous medium, such as deionized or distilled water, at pre-determined concentrations under low shear conditions until such components are completely dissolved in the medium. A concentrated dispersion of the metal oxide abrasive, such as fumed alumina, is added to the medium and diluted to the desired loading level of abrasive in the final polishing slurry.

The polishing slurry of the present invention may be used as one package system (metal oxide abrasive and oxidizing agent, if desired, in a stable aqueous medium), a two package system (the first package consists of the metal oxide abrasive in a stable aqueous medium and the second package consists of the oxidizing agent) or a multi-package system with any standard polishing equipment appropriate for use on the desired metal layer of the wafer. The two or multi package system is used when an oxidizing agent decomposes or hydrolyzes over time. In the two or multi package system, the oxidizing agent and other desirable additives may be added to the slurry just prior to polishing.

The polishing slurry of the present invention has been found to significantly lower or inhibit the silicon dioxide polishing rate, thus yielding enhanced selectivity. In addition, the polishing slurry may be effectively used to provide controlled polishing selectivities to other thin-film materials used as underlayers or barrier films in current integrated circuit technology, such as titanium, titanium nitride and the like. The polishing slurry of the present invention may be used during the various stages of semiconductor integrated circuit manufacture to provide effective polishing at desired polishing rates while minimizing surface imperfections and defects.

Non-limiting illustrations of the polishing slurry of the present invention follow.

EXAMPLE 1

Eight polishing slurries were prepared to investigate the interrelationship between the abrasive, the oxidizing agent and the organic acid on polishing and selectivity in accordance with the present invention. The slurries consisted of fumed alumina, an oxidizing agent, an organic acid, and the remainder deionized water. The properties of the slurries are described in Table I. The slurry was utilized to chemically-mechanically polish an aluminum layer having a thickness of approximately 12,000 Å using a composite pad available from Rodel, Inc., Newark, Del. The polishing conditions and performance results are illustrated in Table II.

TABLE I

| Sample | Abrasive Fumed Alumina Concentration (wt %) | Oxidizing Agent Ammonium Persulfate Concentration (wt %) | Organic Acid Succinic Acid Concentration (wt %) |
|---|---|---|---|
| 1 | 6 | 4 | 5 |
| 2 | 6 | 4 | 0.05 |
| 3 | 6 | 8 | 5 |
| 4 | 6 | 8 | 0.05 |
| 5 | 3 | 4 | 5 |
| 6 | 3 | 4 | 0.05 |
| 7 | 3 | 8 | 5 |
| 8 | 3 | 8 | 0.05 |

TABLE II

| Sample | Pressure (psi) | Flow Rate (ml/min) | Table Speed (rpm) | Spindle Speed (rpm) | Al Polishing Rate (A/min) | Oxide Rate (A/min) | Selectivity* |
|---|---|---|---|---|---|---|---|
| 1 | 5 | 200 | 100 | 125 | 4993 | 13 | 384:1 |
| 2 | 5 | 200 | 100 | 125 | 4662 | 80 | 58:1 |
| 3 | 5 | 200 | 100 | 125 | 4782 | 21 | 228:1 |
| 4 | 5 | 200 | 100 | 125 | 4738 | 54 | 88:1 |
| 5 | 5 | 200 | 100 | 125 | 4196 | 13 | 323:1 |
| 6 | 5 | 200 | 100 | 125 | 4177 | 46 | 91:1 |
| 7 | 5 | 200 | 100 | 125 | 4133 | 15 | 276:1 |
| 8 | 5 | 200 | 100 | 125 | 4445 | 32 | 139:1 |

(*Aluminum:Thermal Oxide Selectivity, i.e. the polishing rate ratio between the aluminum layer and the thermal oxide).

As shown in Table II, increasing the alumina abrasive content from 3% by weight to 6% by weight in the polishing slurry enhanced the aluminum removal rate by approximately 500 A/minute. Increasing the oxidizing agent, ammonium persulfate, from 4% to 8% did not affect any of the response variables significantly. Increasing the organic acid, succinic acid, from 0.05% (samples 2, 4, 6 and 8) to 5% (samples 1, 3, 5 and 7) significantly lowered the oxide removal rate, thereby enhanced the selectivity to thermal oxide by approximately 200:1. This example demonstrates the interrelationship between the metal oxide abrasive, the oxidizing agent and the organic acid of the present invention to improve or enhance the selectivity to oxide polishing rate of the polishing slurry.

EXAMPLE 2

Seven polishing slurries were prepared to investigate the use of various organic acids at various concentrations and their effect on polishing and selectivity in accordance with the present invention. The slurries consisted of fumed alumina, an oxidizing agent, an organic acid, and the remainder deionized water. The properties of the slurries are described in Table III. The slurry was utilized to chemically-mechanically polish an aluminum layer having a thickness of approximately 12,000 Å with a blown polyurethane felt pad (available from Rippey Corporation, El Dorado Hills, Calif.). The polishing conditions and performance results are illustrated in Table IV.

TABLE III

| Sample | Slurry Abrasive(wt %) | Surface Area (m²/g) | Oxidizer (wt %) | Organic Acid (wt %) |
|---|---|---|---|---|
| 1 | Fumed Alumina(5%) | 55 | Ammonium Persulfate(4%) | acetic(0.5%) |
| 2 | Fumed Alumina(5%) | 55 | Ammonium Persulfate(4%) | acetic(3.0%) |
| 3 | Fumed Alumina(5%) | 55 | Ammonium Persulfate(4%) | tartaric(0.5%) |
| 4 | Fumed Alumina(5%) | 55 | Ammonium Persulfate(4%) | tartaric(3.0%) |
| 5 | Fumed Alumina(5%) | 55 | Ammonium Persulfate(4%) | phthalic(0.2%) |
| 6 | Fumed Alumina(5%) | 55 | Ammonium Persulfate(4%) | gluconic(0.5%) |
| 7 | Fumed Alumina(5%) | 55 | Ammonium Persulfate(4%) | gluconic(3.0%) |

TABLE IV

| Sample | Pressure (psi) | Flow Rate (ml/min) | Table Speed (rpm) | Spindle Speed (rpm) | Al Polishing Rate (A/min) | Oxide Rate (A/min) | Selectivity* |
|---|---|---|---|---|---|---|---|
| 1 | 5 | 200 | 50 | 50 | 1963 | 4.3 | 457:1 |
| 2 | 5 | 200 | 50 | 50 | 1451 | 0.2 | 7255 |
| 3 | 5 | 200 | 50 | 50 | 1090 | 1.75 | 623 |
| 4 | 5 | 200 | 50 | 50 | 1128 | 10.35 | 109 |
| 5 | 5 | 200 | 50 | 50 | 1768 | 12.3 | 144 |
| 6 | 5 | 200 | 50 | 50 | 613 | 17.7 | 34.6 |
| 7 | 5 | 200 | 50 | 50 | 341 | 4.75 | 71.8 |

(*Aluminum:Thermal Oxide Selectivity, i.e. the polishing rate ratio between the aluminum layer and the thermal oxide).

Table IV illustrates the a number of different organic acids may be used in the polishing slurry of the present invention to suppress the oxide polishing rate, thereby significantly improving the selectivity. A desirable high selectivity is typically defined as having a removal rate equal or greater than 50:1 between the first layer (aluminum) and the second layer (thermal oxide). In contrast to the previously disclosed slurries of the prior art, the polishing slurry of the present invention exhibits a high degree of selectivity to the insulator layer, $SiO_2$. It should further be noted that the Al rate may need to be improved depending on the desired polishing rate and in order to achieve acceptable wafer throughput.

EXAMPLE 3

The polishing slurries of samples 3 and 4 in Example 2 were further investigated to demonstrate the effect of the present invention on selectivity to other metal layers. The properties of samples 3 and 4 are reproduced in Table V. The slurry was utilized to chemically-mechanically polish a titanium layer having a thickness of approximately 12,000 Å with a Rodel 28" pad (available from Rodel, Inc., Newark, Del.). The polishing conditions and performance results are illustrated in Table VI.

TABLE V

| Sample | Slurry Abrasive(wt %) | Surface Area (m²/g) | Oxidizer (wt %) | Organic Acid (wt %) |
|---|---|---|---|---|
| 1 | Fumed Alumina(5%) | 55 | Ammonium Persulfate(4%) | tartaric(0.5%) |
| 2 | Fumed Alumina(5%) | 55 | Ammonium Persulfate(4%) | tartaric(3.0%) |

TABLE VI

| Sample | Pressure (psi) | Flow Rate (ml/min) | Table Speed (rpm) | Spindle Speed (rpm) | Al Polishing Rate (A/min) | Ti Rate (A/min) | Selectivity* |
|---|---|---|---|---|---|---|---|
| 1 | 5 | 200 | 50 | 50 | 1090 | 259 | 4:1 |
| 2 | 5 | 200 | 50 | 50 | 1128 | 598 | 2:1 |

(*Aluminum:Titanium Selectivity, i.e. the polishing rate ratio between the aluminum layer and the titanium).

Table VI demonstrates that, in addition to improving the aluminum to oxide selectivity, the polishing slurry of the present invention may further be used to increase the Ti removal rate, thereby lowering the selectivity to Ti. A desirable low selectivity is typically defined a having a removal rate equal or less than 10:1 between the first and second layers. More preferred is a removal rate equal or less than 5:1 between the first and second layers. This process can be effectively replicated while fabricating semiconductor circuits to provide the desired selectivity to the Ti cladding film accompanying the Al intra-chip wiring.

It is believed that the buffering capacity or concentration of the organic acid in the polishing slurry has been found to play an important role in promoting low Ti selectivity. The buffering capacity, which may be represented by the free acid component of the slurry, may be determined by utilizing known techniques to calculate the free acid to total acid points.

EXAMPLE 4

A polishing slurry was prepared to evaluate the dissolution and self-passivation of aluminum. The slurry consisted of 3% by weight fumed alumina as the abrasive, 3% succinic acid as the organic acid, 4% ammonium persulfate as the oxidizing agent and the remainder deionized water. A rotating disk electrode (RDE) system setup, as illustrated in FIG. 1, was adopted to evaluate the dissolution rate of aluminum with a continuous renewal of the aluminum surface by abrasion, as well as the corrosion and passivation of the metal in the slurry immediately after the abrasion. A metallic sample consisting of aluminum and copper in the form of a slug was embedded in a stick-resistant sleeve and attached to a rotating motor. The electrode was placed into an electrochemical cell with a scouring pad at the bottom. With a controlled rotation of 500 rpm and downward pressure of 1200 grams, the metal surface of the slug was abraded by the slurry and its dissolution was determined by simultaneously calculating electrochemical data provided by the electrode. After the measurement with abrasion was complete (taking approximately 100 seconds), the electrode was raised away from the pad while continuing the rotation of the electrode and simultaneously recording the electrode potential. Once the potential was stabilized, after approximately 5 minutes, the potentiodynamic polarization was re-applied to determine the rate of dissolution in the absence of the abrasion. A sweep rate of 10 mV/sec and a sufficiently large potential range was allowed to provide an estimate of the rates and of the rate determining steps.

Figure 2:
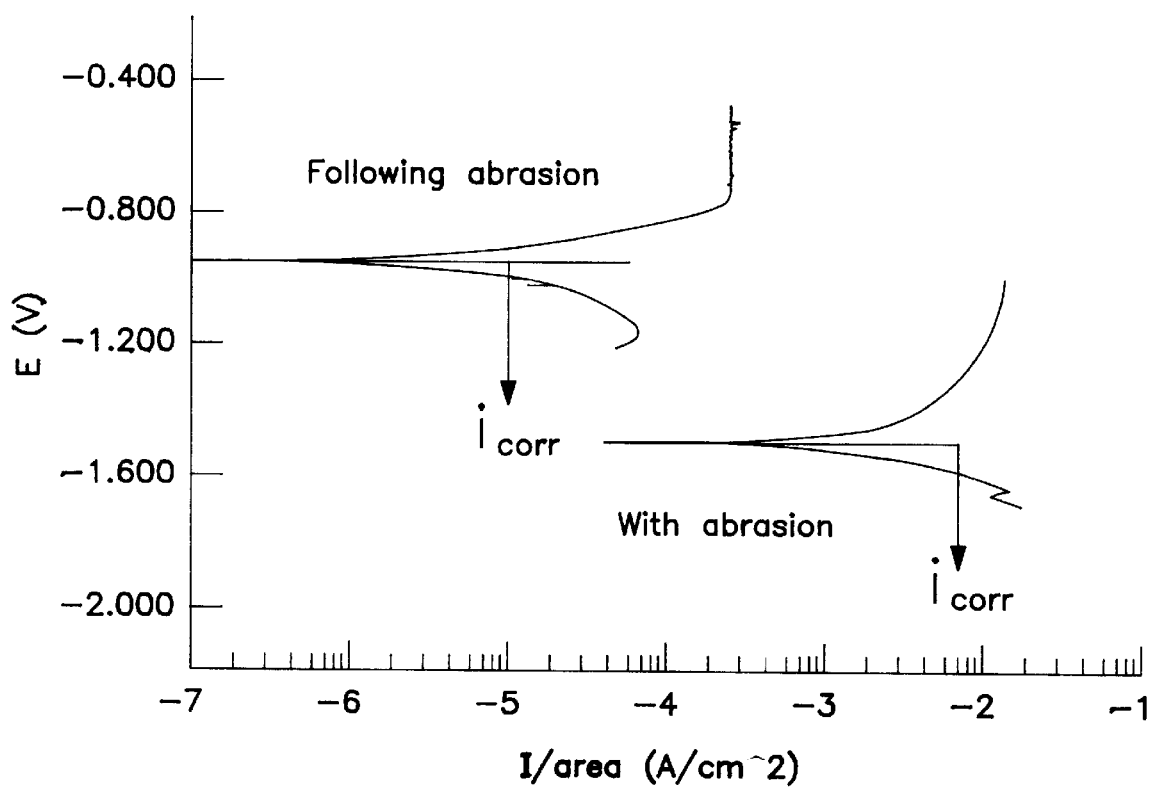
FIG. 2 is an illustration of electrochemical data measured as a function of polishing in A/$cm^2$ on the x-axis versus potential in volts on the y-axis during abrasion and following abrasion of a aluminum-copper slug.
Figure 3:
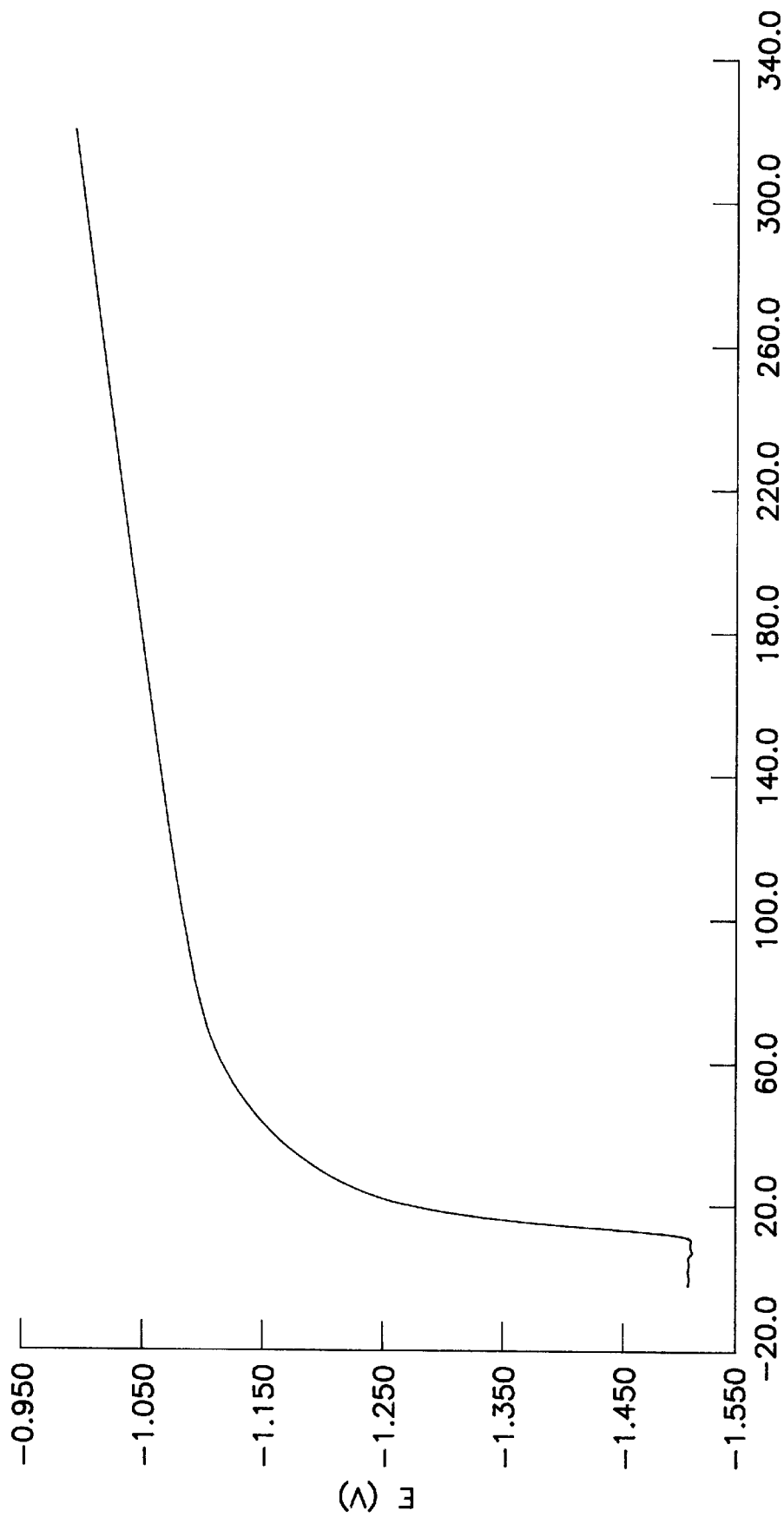
FIG. 3 is an illustration of the change in corrosion potential in volts on the y-axis measured as a function of time on the x-axis once the surface abrasion has been discontinued.

The results obtained from the slurry are demonstrated in FIGS. 2 and 3. During the abrasion step, aluminum dissolves at a rate of $7.2 \times 10^{-3}$ $Å/cm^2$ (1,728 Å/minute). However, as noted in FIG. 3, as soon as the abrasion is stopped, the aluminum potential readily increases and the repassivation of the surface sets in. The dissolution of aluminum after the abrasion (which is equivalent to wet etching) is low, that is at about $1 \times 10^{-5} Å/cm^2$ or 2.4 Å/min. The shape of the potential time curve indicates that normally corrosion-sensitive aluminum readily repassivates. As a result, the organic acid was found to act as a corrosion inhibitor, thereby minimizing concerns of any uncontrollable corrosion loss during CMP processing.

As described herein, the oxidizing agent, the organic acid, and other additives, of the polishing slurry can be tailored to provide effective polishing to metal layers at desired polishing rates while minimizing surface imperfections, defects and uncontrollable corrosion lost. In addition, the polishing slurry of the present invention has been found to significantly lower or inhibit the silicon dioxide polishing rate, thus yielding enhanced selectivity with respect to the dielectric layer. Furthermore, the polishing slurry may be effectively used to provide controlled polishing selectivities to other thin-film materials used in current integrated circuit technology, such as copper and titanium, as well as underlayers such as titanium, titanium nitride, titanium tungsten and similar alloys.

It is further understood that the present invention is not limited to the particular embodiments shown and described herein, but that various changes and modifications may be made without departing from the scope and spirit of the invention.

What is claimed is:

1. A method for chemical-mechanical polishing of a substrate containing an insulator layer and at least one metal layer or thin-film, the method which comprises the steps of:
    a) providing a chemical mechanical polishing slurry comprising: an aqueous medium, an abrasive, an oxidizing agent, and succinic acid, wherein the selectivity between said metal layer or thin-film and said insulator layer is equal or greater than 50:1; and
    b) chemical mechanical polishing a metal layer or thin-film on a semiconductor substrate with said slurry.

2. The method of claim 1, wherein said metal layer or thin-film is selected from the group consisting of: aluminum, copper, titanium, tantalum, and alloys thereof.

3. The method of claim 2, wherein said metal layer or thin-film is aluminum or aluminum alloy.

4. The method of claim 3, wherein said aluminum layer or thin-film further comprises at least one underlayer selected from the group consisting of titanium, titanium nitride, titanium tungsten, tantalum, and mixtures thereof.

5. The method of claim 2, wherein said metal-layer or thin-film is copper.

6. The method of claim 5, wherein said copper layer on thin-film further comprises at least one underlayer selected from the group consisting of: titanium, titanium nitride, titanium tungsten, tantalum, and mixtures thereof.

7. The method of claim 1, wherein said aqueous medium is deionized water.

8. The method of claim 1, wherein said aqueous medium is distilled water.

9. The method of claim 1, wherein said abrasive is a metal oxide abrasive.

10. The method of claim 9, wherein said metal oxide abrasive is selected from the group consisting of: alumina, ceria, germania, titania, silica, zirconia, and mixtures thereof.

11. The method of claim 9, wherein said metal oxide abrasive consists of metal oxides aggregates having a size distribution less than about 1.0 micron, a mean aggregate diameter less than about 0.4 micron.

12. The method of claim 9, wherein said metal oxide abrasive consists of discrete, individual metal oxide spheres having a primary particle diameter less than 0.400 micron and corresponding surface area ranging from about 10 m$^2$/g to about 250 m$^2$/g.

13. The method of claim 1, wherein said abrasive has a surface area ranging from about 5 m$^2$/g to about 430 m$^2$/g.

14. The method of claim 13, wherein said abrasive has a surface area ranging from about 30 m$^2$/g to about 170 m$^2$/g.

15. The method of claim 1, wherein said abrasive is present in said slurry in a range between about 0.5% and 55% by weight.

16. The method of claim 15, wherein said abrasive is present in said slurry in a range between about 1% and 10% by weight.

17. The method of claim 9, wherein said metal oxide abrasive is a precipitated abrasive or a fumed abrasive.

18. The method of claim 10, wherein said alumina is a precipitated alumina or a fumed alumina.

19. The method of claim 1, wherein said oxidizing agent is an oxidizing metal salt.

20. The method of claim 1, wherein said oxidizing agent is an oxidizing metal complex.

21. The method of claim 1, wherein said oxidizing agent is an oxidizing nonmetallic complex.

22. The method slurry of claim 21, wherein said oxidizing nonmetallic complex is ammonium persulfate, hydrogen peroxide, peracetic acid, periodic acid and mixtures thereof.

23. The method of claim 1, wherein said oxidizing agent is selected from the group consisting of: iron salts, aluminum salts, sodium salts, potassium salts, ammonium salts, quaternary ammonium salts, phosphonium salts, peroxides, chlorates, perchlorates, nitrates, permanganates, persulfates and mixtures thereof.

24. The method of claim 1, wherein said succinic acid is present in said slurry in an amount sufficient to improve the oxide selectivity of said slurry.

25. The method of claim 24, wherein said succinic acid is present in an amount between 0.5% and about 7% by weight.

26. The method of claim 1, wherein said slurry further comprises a surfactant.

27. The method of claim 26, wherein said surfactant is selected from the group consisting of: anionic surfactants, cationic surfactant, nonionic surfactants, amphoteric surfactants, and mixtures thereof.

28. The method of claim 1, wherein said slurry further comprises an inorganic acid.

29. The method of claim 1, wherein said slurry further comprises an inorganic salt.

30. The method of claim 4, wherein the selectivity between said aluminum layer or thin-film and said underlayer is equal or less than 10:1.

31. The method of claim 6, wherein the selectivity between said copper layer or thin-film and said underlayer is equal or less than 10:1.

32. A chemical-mechanical polishing slurry for polishing a substrate containing an insulator layer and at least one metal layer or thin-film comprising:
    an aqueous medium
    an abrasive
    an oxidizing agent; and succinic acid, wherein the selectivity between said metal layer or thin film and said insulator layer is equal to or greater than 50:1.

33. The slurry of claim 32, wherein said aqueous medium is deionized water.

34. The slurry of claim 32, wherein said aqueous medium is distilled water.

35. The slurry of claim 32, wherein said abrasive is a metal oxide abrasive.

36. The slurry of claim 35, wherein said metal oxide abrasive is selected from the group consisting of: alumina, ceria, germania, silica, titania, zirconia, and mixtures thereof.

37. The slurry of claim 35, wherein said metal oxide abrasive consists of metal oxides aggregates having a size distribution less than about 1.0 micron, a mean aggregate diameter less than about 0.4 micron.

38. The slurry of claim 35, wherein said metal oxide abrasive consists of discrete, individual metal oxide spheres having a primary particle diameter less than 0.400 micron and a surface area ranging from about 10 m$^2$/g to about 250 m$^2$/g.

39. The slurry of claim 32, wherein said abrasive has a surface area ranging from about 5 m$^2$/g to about 430 m$^2$/g.

40. The slurry of claim 39, wherein said abrasive has a surface area ranging from about 30 m$^2$/g to about 170 m$^2$/g.

41. The slurry of claim 32, wherein said abrasive is present in said slurry in a range between about 0.5% and 55% by weight.

42. The slurry of claim 41, wherein said abrasive is present in said slurry in a range between about 1% and 10% by weight.

43. The slurry of claim 35, wherein said metal oxide abrasive is a precipitated abrasive or a fumed abrasive.

44. The slurry of claim 36, wherein said alumina is a precipitated alumina or a fumed alumina.

45. The slurry of claim 32, wherein said oxidizing agent is an oxidizing metal salt.

46. The slurry of claim 32, wherein said oxidizing agent is an oxidizing metal complex.

47. The slurry of claim 32, wherein said oxidizing agent is an oxidizing nonmetallic compound.

48. The slurry of claim 47, wherein said oxidizing nonmetallic compound is ammonium persulfate, hydrogen peroxide, peracetic acid, periodic acid and mixtures thereof.

49. The slurry of claim 32, wherein said oxidizing agent is selected from the group consisting of: iron salts, aluminum salts, sodium salts, potassium salts, ammonium salts, quaternary ammonium salts, phosphonium salts, peroxides, chlorates, perchlorates, nitrates, permanganates, persulfates and mixtures thereof.

50. The slurry of claim 32, wherein said succinic acid is present in said slurry in an amount sufficient to improve the oxide selectivity of said slurry.

51. The slurry of claim 50, wherein said succinic acid is present in an amount between 0.5% and about 7% by weight.

52. The slurry of claim 32, wherein said slurry further comprises a surfactant.

53. The slurry of claim 52, wherein said surfactant is selected from the group consisting of: anionic surfactants, cationic surfactants, nonionic surfactants, amphoteric surfactants, and mixtures thereof.

54. The slurry of claim 32, wherein said slurry further comprises an inorganic acid.

55. The slurry of claim 32, wherein said slurry further comprises an inorganic salt.

* * * * *